(12) United States Patent
Schroeder et al.

(10) Patent No.: US 7,248,536 B2
(45) Date of Patent: Jul. 24, 2007

(54) INTEGRATED SEMICONDUCTOR MEMORY AND METHOD FOR OPERATING AN INTEGRATED SEMICONDUCTOR MEMORY

(75) Inventors: Stephan Schroeder, Munich (DE); Arndt Gruber, Munich (DE); Manfred Proell, Dorfen (DE); Herbert Benzinger, Dorfen (DE)

(73) Assignee: Infineon Technologies AG, Munich (DE)

( * ) Notice: Subject to any disclaimer, the term of this patent is extended or adjusted under 35 U.S.C. 154(b) by 99 days.

(21) Appl. No.: 11/245,455

(22) Filed: Oct. 6, 2005

(65) Prior Publication Data

US 2006/0083100 A1    Apr. 20, 2006

(30) Foreign Application Priority Data

Oct. 6, 2004    (DE) ...................... 10 2004 048 699

(51) Int. Cl.
*G11C 8/00* (2006.01)
(52) U.S. Cl. .............................. 365/230.06; 365/230.01
(58) Field of Classification Search ........... 365/230.06, 365/230.01
See application file for complete search history.

(56) References Cited

U.S. PATENT DOCUMENTS 5,648,933 A    7/1997 Slemmer 6,058,050 A  *  5/2000 Wu et al. ............... 365/189.09
6,236,617 B1    5/2001 Hsu et al.

FOREIGN PATENT DOCUMENTS

DE    600 06 162 T2    7/2004

* cited by examiner

*Primary Examiner*—Richard T. Elms
*Assistant Examiner*—N Nguyen
(74) *Attorney, Agent, or Firm*—Slater & Matsil, L.L.P.

(57) ABSTRACT

A semiconductor memory and a method for operating the latter in order are provided, at least in testwise fashion, to deactivate a word line segment (12) of a segmented word line not via a first line (21) otherwise used for deactivation, but rather via a second line (22) via that the word line segment (12) is otherwise activated. The second line (22) can optionally be biased with a second potential (Vpp) provided for activation or with a third potential (Vgnd). If the third potential (Vgnd) is used for at least temporarily deactivating the word line segment (12), the word line segment can be driven via a switching element (17), which couples the word line segment to the second line (22), without the complementary switching element (16) of the driver segment (20) having to be used for deactivation. It can thereby be ascertained which of two switching elements (16, 17) of the driver segment is defective and whether or not the semiconductor memory will function in a manner free of errors after permanent replacement of the word line on account of a floating potential of the tested word line segment (12).

25 Claims, 4 Drawing Sheets

INTEGRATED SEMICONDUCTOR MEMORY AND METHOD FOR OPERATING AN INTEGRATED SEMICONDUCTOR MEMORY

This application claims priority to German Patent Application 10 2004 048 699.9 which was filed Oct. 6, 2004, and is incorporated herein by reference.

TECHNICAL FIELD

The invention relates to an integrated semiconductor memory and to a method for operating an integrated semiconductor memory.

BACKGROUND

In integrated semiconductor memories, digital information items are stored in a multiplicity of memory cells, which are in each case connected to a bit line and to a word line. Volatile semiconductor memories, in particular DRAMs (dynamic random access memory), have memory cells each having a selection transistor and a storage capacitor. The storage capacitor may be formed as a trench capacitor or as a stacked capacitor, and the selection transistor may be formed in particular as a MOSFET (metal oxide semiconductor field effect transistor). One electrode of the storage capacitor is connected to one source/drain region of the selection transistor. The other source/drain region is connected to a bit line. The gate electrode is connected to the word line and at the same time forms a word line section. The gate electrode is isolated from a channel region of the selection transistor by a gate oxide. A multiplicity of selection transistors are connected to each word line.

Present-day semiconductor memories generally have segmented word lines each having a master word line and a multiplicity of word line segments connected to the master word line. The word line segments are usually formed from polysilicon and form the gate electrodes of the connected selection transistors. In general, the same number of selection transistors is connected to each word line segment of a word line. The metallic master word line has a higher electrical conductivity than the word line segments made of polysilicon. In order that the master word line can be dimensioned wider for the sake of further improved conductivity, it is often connected to a plurality of rows of word line segments, for instance two rows of word line segments running alongside one another. It is thereby possible to reduce the number of master word lines in relation to the number of word line segments.

The metallic master word line serves for rapidly transmitting the word line potentials to all the connected selection transistors. On account of the increasing miniaturization of structure elements of modern semiconductor circuits and on account of the ever higher transmission speeds and clock frequencies, the word line segments are nowadays driven actively in order to achieve faster switching of the selection transistors connected to the word lines. In this case, in addition to a word line driver to which the master word line is connected, a driver segment is also provided for each word line element, which driver segment supplies the respective word line segment (and also in each case a word line segment of further adjacent word lines) directly with the respective word line potential. From the multiplicity of driver segments, the word line potential passes to all the connected selection transistors more rapidly than if only the end of the master word line is connected to the word line potential. The potential provided for activating a word line is usually designated by Vpp, and the potential provided for deactivating the word line is designated by Vnwll. If a segmented word line is driven actively, these two potentials are in each case applied directly to all the word line segments of the word line to be activated or deactivated.

On account of manufacturing tolerances, the electrical connections between the word line segments and the master word line may be at high impedance or completely interrupted so that an individual word line segment cannot be brought or cannot be brought rapidly enough to the envisaged word line potential. Defective electrical connections may arise, for example, as a result of high-impedance contact hole fillings that connect a word line segment to the master line. In the case of an actively driven word line, there are even two contact hole fillings provided between a word line segment and the master word line. Within the driver segments of the word line driver as well, defective or high-impedance electrical connections such as contact hole fillings may prevent the word line segment that is to be driven from being supplied with the respective word line potential.

By way of example, it may happen that on account of defective contact hole fillings within a driver segment, although the word line segment can be activated, it cannot be deactivated, or vice versa. Such circuit faults are based on production tolerances, particularly in the lithographic patterning of contact holes, if, during the production of etching masks, for example, lateral positional errors occur, as a result of which conductive structures that are to be arranged on one another are not connected to one another at sufficiently low impedance. Furthermore, surface alterations of conductive structures produced, contaminants or other influences may lead to electrical decoupling of individual word line segments. Such word line segments that are not supplied, or are not supplied rapidly enough, with the respective word line potential are influenced by electrical potentials in their vicinity after the end of the activation operation or deactivation operation and assume a fluctuating or "floating" potential, which adapts to the respective ambient potential and is virtually unforeseeable. The selection transistors connected to these floating word line segments then switch uncontrollably, as a result of which the charges stored in the connected storage capacitors may pass on to the bit lines. This leads to read-out errors when reading from other, actually intact memory cells. On the basis of a test pattern of tested memory cells, it is thus not possible to reliably localize which word line segments are floating.

The localization of floating word lines is furthermore made more difficult, in the case of segmented word lines driven segment by segment with the aid of driver segments, when only one of the word line potentials Vpp and Vnwll to be provided is not fed, or is not fed rapidly enough, to the word line segment. This is caused by the design of the driver segments, which have an inverter having a pFET transistor and an nFET transistor, of which one transistor is connected to the potential Vpp and the other transistor is connected to the potential Vnwll. The potential fed to the master word line switches one of the two transistors into the on state, so that the connected word line segment ideally immediately assumes the envisaged potential. However, if one of the two transistors has no or only a high-impedance electrical connection to the word line segment, either only the activation or the deactivation of the word line segment functions.

Semiconductor memories having word lines which, although having been replaced by redundant word lines and permanently electrically disconnected from the voltage supply, are nevertheless floating cannot be reliably used and have to be disposed of as rejects. At least when a defective word line cannot be deactivated and only its activation operation functions, the potential of the disconnected, but nevertheless floating word line tends toward the activation potential Vpp and leads to unforeseeable read-out errors when reading from other memory cells not connected to the relevant word line at all. Since, in this case, replacing the word line by a redundant word line does not prevent the defective word line from floating in a manner tending toward the activation potential, the relevant semiconductor chip is not functional even after a word line repair.

If, conversely, a word line can indeed still be deactivated, but can no longer be activated (for instance in the case of an intact connection to the deactivation potential Vnwll and a defective connection to the activation potential Vpp), after the defective word line has been replaced by a redundant word line, the semiconductor chip can continue to be used, by contrast, since the floating potential—tending toward the Vnwll—of the replaced word line keeps the selection transistors of the connected memory cells closed. For distinguishing the case of whether or not the semiconductor chip can still be used after a defective word line has been replaced, it is necessary to carry out a complicated electrical functional test, to be precise after repairing and replacing defective word lines. Since such a functional test has already been carried out in order to identify defective word lines, the functional test carried out subsequently increases the manufacturing costs still further.

For possible use of the semiconductor chip, it must nevertheless be ensured that no read-out errors occur on account of floating word line segments. If it were possible to distinguish on the basis of an electrical functional test whether the potential of a floating word line tends toward the activation potential or toward the deactivation potential, the reject rate of the fabricated semiconductor chips could be significantly reduced. The semiconductor chips whose floating word lines tend toward the deactivation potential after they have been replaced by redundant word lines could continue to be used, whereas those semiconductor chips whose word line potential of the affected word lines tends toward the activation potential would be disposed of. However, in order to make a reliable ascertainment about whether the potential of a floating, replaced word line tends toward the activation potential or toward the deactivation potential, it is necessary to carry out electrical functional tests which, if the intention is to make an ascertainment that is probably if not certainly accurate, requires such a long expenditure of time that carrying out such a test is no longer economically practical. For this reason, this additional functional test is often dispensed with in practice.

SUMMARY OF THE INVENTION

In one aspect, the present invention provides an integrated semiconductor memory that can be operated such that, in the case of defective word lines to be replaced, it is possible to determine rapidly and reliably whether the semiconductor memory will function reliably after its defective word lines have been replaced. In particular embodiments, the intention is to enable the semiconductor memory to be operated such that it is possible to determine reliably and rapidly whether a word line that has already been identified as defective and has at least one floating word line segment is floating toward the activation potential or toward the deactivation potential. Furthermore, embodiments of the present invention specify a method for operating and for rapidly and reliably testing such a semiconductor memory.

In a first embodiment, an integrated semiconductor memory includes a multiplicity of memory cells each having a transistor connected to a word line. The word line has a master word line and has at least one word line segment. The word line segment is connected to a driver segment of a word line driver and the driver segment is connected to the master word line. The word line segment, depending on the bias voltage of the master word line, by means of the driver segment to which it is connected, is electrically connectable either to a first line providing a first potential, which deactivates the word line segment, or to a second line. The second line is able to be biased such that it provides either a second potential, which activates the word line segment, or a third potential, the magnitude of which lies between the first potential and the second potential. The semiconductor memory is designed such that it can be operated in an operating mode, in which, upon deactivation of the word line segment, the word line segment is biased with the third potential via the second line, the electrical connection between the word line segment and the first line remaining interrupted.

Embodiments of the invention propose a semiconductor memory in which, at least in testwise fashion, the deactivation of a word line and of the associated word line segment can be carried out in such a way that the word line segment, instead of being biased with the deactivation potential Vwnll provided by means of the first line, is biased via the second line with a different potential Vgnd, which lies between the activation potential Vpp and the deactivation potential Vnwll. According to embodiments of the invention, consequently, at least in an optional mode of operation of the semiconductor memory, the deactivation of the word line segment is effected by means of the same transistor of the driver segment that also activates the word line segment. Embodiments thus propose equipping a semiconductor memory such that, at least in an optional test operating mode, a word line segment to be tested is connected via in each case the same transistor to in each case the same line which, depending on whether an activation or deactivation operation is involved, is biased either with the activation potential Vpp or with a potential Vgnd suitable for deactivation.

Conventionally, both during normal operation and during the electrical functional test, the activation and the deactivation of a word line segment are always effected by means of two different, mutually complementary transistors or other switching elements of an inverter present in the driver segment. If only one of these two transistors is nonfunctional by virtue of a defective contact hole filling and cannot produce an electrical connection between the word line segment and the relevant voltage supply line, it cannot readily be determined which of these two transistors is defective. With the semiconductor memory according to embodiments of the invention, however, it is possible for the first time to determine rapidly and reliably, which of these two transistors is defective, because the semiconductor memory can be operated such that both the activation and the deactivation of a word line segment are effected by means of the same voltage supply line and the same transistor of the driver segment. If the activation and the deactivation of a word line segment with the aid of the transistor or a corresponding switching unit function reliably and if information items can consequently be reliably written to the memory cells connected to the word line segment and be read out again without information items being lost or corrupted, then it is thus established that this transistor—which is otherwise used only for activation—of the word line segment is intact and in all probability the complementary transistor used for deactivation during normal operation of the semiconductor memory must be defective. It can thus already be discerned that the word line segment will be floating toward the activation potential even after replacement by a redundant word line and the semiconductor chip will, therefore, not function reliably. This ascertainment can be effected, according to embodiments of the invention, with the aid of an electrical functional test in which exclusively those memory cells or at least one of those memory cells that are connected to the defective word line segment are or is read. Consequently, it is not necessary to test arbitrary memory cells connected to other word lines in respect of whether they can no longer be reliably read by virtue of the defective and subsequently repaired word line segment having a floating potential. This obviates the need for a complicated second electrical functional test in which it would be necessary to check the entirely satisfactory functioning of memory cells connected to other intact word lines. Instead of this, only a short functional test need be carried out in which, merely for one or more memory cells connected to the defective word line segment, in an operating mode in which the word line segment is both activated and deactivated by in each case the same line and by means of in each case the same transistor of the driver segment, a check is made to determine whether the stored information items are read out correctly.

As a result, this eliminates a considerable cost disadvantage in the fabrication of integrated semiconductor memories and it is possible, even before defective word lines are replaced by redundant word lines, to determine whether or not such a repair will lead to entirely satisfactory functioning of a semiconductor memory. Consequently, it is also possible, in advance, to dispense with a repair of semiconductor circuits in which, for at least one word line segment, the transistor thereof provided for its deactivation does not produce an electrical connection. Such a semiconductor chip can immediately be disposed of; the repair and a possible repeated functional test for the entire cell array are obviated. On account of the case distinguishing—which is possible for the first time according to embodiments of the invention and can be determined easily—regarding the case of which of the transistors used for activating and for deactivating a word line segment is defective, a considerable cost factor and expenditure of time can be saved during manufacture.

It is preferably provided that, in the first operating mode, both upon activation and upon deactivation of the word line segment, the electrical connection between the word line segment and the first line is interrupted and there is a conductive connection between the word line segment and the second line. The first operating mode serves for ascertaining whether the activation operation or the deactivation operation is not functioning in the case of a defective word line segment. In this test operating mode, both operations are, therefore, carried out such that, both upon activation and upon deactivation, the word line segment is in each case connected to the same, second line and is biased with the respective potential by the line. The electrical connection between the word line segment and the first line is thus interrupted in both operations. This can easily be realized by means of a corresponding potential of the master word line. Consequently, by virtue of the word line segment being operated with the aid only of the second line in the first operating mode, the electrical connection between the word line segment and the line can be classified as intact or defective. It can be identified from this whether the electrical connection to the other line, namely the first line, must be defective or intact.

It is preferably provided that the driver segment has two switching units, a first switching unit being connected between the word line segment and the first line, and the second switching unit being connected between the word line segment and the second line, and, depending on the bias voltage of the master word line, either the first switching unit or the second switching unit being switched into the on state and the respective other switching unit being switched into the off state. In volatile semiconductor memories, in particular DRAMs, the driver segments of a word line driver are in each case provided with an inverter having two switching units. In practice, the two switching units are realized by two mutually complementary field effect transistors. The first switching unit (for example an nFET), if connected by intact contact hole fillings, connects the word line segment to the first line, which provides the first potential Vnwll required for deactivation. The second switching unit, preferably a pFET (p-channel field effect transistor), if connected by intact contact hole fillings, connects the word line segment to the second line, which, upon activation, provides the activation potential Vpp and can also be biased to a lower potential Vgnd below the threshold voltage of the selection transistors of the memory cells. Since the two switching units are mutually complementary field effect transistors whose gate electrodes are connected to the master word line jointly in parallel with one another, either one or the other of the two switching units can be switched into the on state with the aid of the master word line. This also holds true if components other than switching units are provided instead of complementary field effect transistors.

It is preferably provided that, upon deactivation of the word line segment, the master word line is biased with a bias voltage that conductively connects the word line segment to the second line via the second switching unit, the second line being biased with the third potential upon deactivation of the word line segment. It is thus proposed to operate the master word line at least in the first operating mode such that the word line segment, during the deactivation operation, unlike conventional practice, is electrically connected to the second line rather than to the first line. For this purpose, the master word line is biased such that it switches the second switching unit into the on state and the first switching unit into the off state instead of vice versa. Although the word line segment, during the deactivation operation, is thereby connected to the same line that provides the activation potential upon activation, according to embodiments of the invention, the second line is biased such that, during the deactivation operation, it provides a third potential Vgnd, which lies between the first and second potentials and is suitable at least for temporarily deactivating the word line segment.

It is preferably provided that a third switching unit is provided, which is connected between the word line segment and the first line in parallel with the first switching unit. This third switching unit, which may likewise be a field effect transistor of the same conduction type as the first switching unit, conventionally serves to ensure that the word line segment assumes either the activation potential or the deactivation potential. The third switching unit is also referred to as a restore transistor.

It is preferably provided that the second line is controlled such that it provides the second potential upon activation of the word line segment and the third potential upon deactivation of the word line segment. Consequently, at least in the first operating mode—which can be carried out for example in testwise fashion—of the semiconductor memory according to embodiments of the invention, the activation and the deactivation of the word line segment are effected by means of the same voltage supply line in each case, namely the second line, and thus consequently also by means of the same switching unit in each case, in particular the same field effect transistor of the driver segment.

It is preferably provided that the switching units are connected to the word line segment and/or to the first line and the second line with the aid of contact hole fillings. If contact hole fillings are connected at high impedance, or are not connected at all, to the structure with which contact is to be made, the contact hole fillings cause failures of the connected transistor of the driver segment and prevent an activation or deactivation operation that is to be performed with the aid of the transistor for the affected word line segment.

It is preferably provided that the semiconductor memory is designed such that, in the first operating mode, the word line segment, after it has been deactivated, is electrically isolated from the second line. The word line segment is then at the third potential Vgnd, which has a magnitude lying between the magnitude of the activation potential and that of the deactivation potential. The word line segment will remain at the third potential at least over a certain period of time. If an electrical functional test is effected at one of these memory cells within a sufficiently short period of time, to be precise before the word line segment biased with the third potential possibly starts to float, then it is possible, in the first operating mode, rapidly to determine whether the electrical connection to the second line is intact and enables reliable activation and also deactivation of the word line segment.

The third potential preferably lies below the threshold voltage of the selection transistors.

It is preferably provided that the semiconductor memory in the first operating mode stores information items in at least one memory cell connected to the word line segment and reads them out again, the read-out being effected within a time duration after writing within which the word line segment biased with the third potential reliably turns off the transistor of the memory cell. The maximum time duration that can be achieved in the first operating mode—which is preferably carried out in testwise fashion—and guarantees reliable storage of information items (retention time) is shorter than in normal operation of the semiconductor memory, since the third potential is also closer to the activation potential, that is to say the second potential, than the first potential. However, if an electrical functional test is carried out at the memory cells connected to the word line segment to be tested, with a reduced storage duration, then despite the shortened retention time the semiconductor memory can be operated reliably for test purposes in order to ascertain the type of electrical defect of the affected word line segment. Despite this, the semiconductor memory can be operated with the customary, longer retention time in normal operation, where the activation is effected with the aid of the first potential and by means of the first line and the first switching unit.

It is preferably provided that, in the first operating mode, the word line segment is deactivated by virtue of the fact that the potential of the second line is brought from the second potential to the third potential before the second switching unit is turned off and the electrical connection between the word line segment and the second line is interrupted. This embodiment makes it possible, merely with the aid of altering the temporal sequence when operating the driver segment, to have the effect that in the first operating mode, for the deactivation of the word line segment, the latter is biased with the third potential. For this purpose, it is merely necessary to effect charge reversal of the second line from the activation potential Vpp to the third potential Vgnd at an instant that precedes that instant at which the second switching unit is turned off and the electrical connection between the word line segment and the second line is interrupted. Consequently, just by altering the control timing during the operation of the semiconductor memory, a totally different mode of operation proposed for the first time in accordance with embodiments of the invention can be realized without relatively large structural design alterations of the chip-internal circuit construction having to be provided and accommodated on the chip area. This embodiment of the semiconductor memory according to the invention can thus be realized very cost-effectively since, merely by rearranging temporal operating parameters, it enables two mutually alternative operating modes, namely normal operation and a first operating mode that can be implemented in testwise fashion.

It is preferably provided that the switching units are field effect transistors, the first switching unit and the second switching unit being field effect transistors of mutually opposite conductivity types. By way of example, the first switching unit may be an n-channel transistor and the second switching unit may be a p-channel transistor, or vice versa. A third switching unit that is possibly present is realized like the first switching unit, for example likewise as an n-channel transistor.

Finally, it is provided that the semiconductor memory is a volatile random access memory, for example a DRAM.

In another embodiment, the invention discloses a method for operating an integrated semiconductor memory that has at least one word line having a master word line and at least one word line segment connected to a driver segment of a word line driver. The word line segment, depending on the bias voltage of the master word line, is connectable either to a first line, providing a first potential, or to a second line. The word line segment is activated by connecting the word line segment to the second line and biasing the second line with a second potential, which activates the word line segment. The word line segment is deactivated by firstly bringing the potential of the second line from the second potential to a third potential, the magnitude of which lies between the first potential and the second potential, and then electrically isolating the word line segment from the second line.

A method for operating an integrated semiconductor memory by means of which the latter can be operated in a first operating mode, in which the word line segment is activated and also deactivated by means of the second line. The second line can already be optionally biased with an activation potential Vpp, i.e., the second potential, and another potential, the third potential, in conventional semiconductor memories. The third potential line between the second potential and the first potential provided by the first line for deactivating the word line segment. The ground potential Vgnd is often used as the third potential, with which the second line is biased if it is not currently activating the word line segment. According to embodiments of the invention, when the word line segment is intended to be deactivated, the second line is biased with the third potential and conductively connected to the word line segment via the second switching unit. As a result, the word line segment is biased with the third potential Vgnd instead of with the first potential Vnwll. The deactivation thereby achieved, once the word line segment has been electrically decoupled again, does not last as long as in the case of a deactivation with the aid of the first potential Vnwll, because the third potential is not as far from the threshold voltage of the second switching element as the first potential Vnwll. The retention time of the word line segment in the operating mode according to embodiments of the invention is nevertheless long enough to store information items in the memory cells connected to the word line segment and to read them out again a short time later and compare them with the information items previously written in. As a result, even when the word line that is deactivated with the third potential Vgnd does not ensure a sufficiently long storage duration for normal memory operation, an electrical functional test can be carried out, at least in testwise fashion, at the memory cells directly connected to the word line.

It is preferably provided that the driver segment has two switching units, a first switching unit being connected between the word line segment and the first line, and a second switching unit being connected between the word line segment and the second line, and, depending on the bias voltage of the master word line, either the first switching unit or the second switching unit being switched into the on state and the respective other switching unit being switched into the off state. Upon deactivation of the word line segment, the master word line is held at a bias voltage that conductively connects the word line segment to the second line via the second switching unit at least until the potential of the second line has been brought from the second potential to the third potential. Consequently, it is provided that, for the deactivation of the word line segment, firstly the potential of the second line is brought from Vpp to Vgnd (or some other suitable potential lying below the threshold voltage of the second switching element) and only afterward is the electrical connection between the word line segment and the second line interrupted.

It is preferably provided that the word line segment is activated a first time and deactivated again, in which case, with the aid of the word line segment activated for the first time, a transistor of a memory cell is opened and an information item is written to the memory cell, and the word line segment is activated a second time and deactivated again, an information item being read from the memory cell with the aid of the word line segment activated for the second time. With the aid of the method according to embodiments of the invention, a selection transistor of a memory cell can be kept closed by the third potential and opened for a temporarily limited period of time with the aid of the second potential. This procedure can be used for writing and reading information items in a manner similar to writing and reading information items in normal operation of the semiconductor memory, where the selection transistors, if they are not opened temporarily, are kept closed with the aid of the first potential Vnwll of the word line segment. If the procedure according to embodiments of the invention of momentary activation with the aid of the second potential and deactivation with the aid of the third potential is repeated at least once, then it is possible, on the first occasion, to write an information item to a memory cell connected to the word line segment and, in the course of the repetition, to read out an information item from the memory cell. It is thus possible to carry out an electrical functional test that functions in the same way as during normal operation of the semiconductor memory but works with a somewhat shorter retention time.

Accordingly, it is provided that the temporal interval between the first deactivation of the word line segment and the second activation of the word line segment is chosen to be shorter than a refresh time in a normal operating mode of the semiconductor memory.

It is preferably provided that a check is made to determine whether the information item read from the memory cell matches the information item previously written to the memory cell.

It is furthermore provided that the semiconductor memory is operated in testwise fashion in the first operating mode in order to identify various types of defects of word line segments. Such defects are, in particular, defects of the first or of the second switching unit or both of the first and of the second switching unit of the driver segment. The associated word line segment may then be either only deactivated, only activated or neither activated nor deactivated.

It is preferably provided that prior to the testwise operation of the semiconductor memory in the first operating mode the semiconductor memory is firstly operated in a normal operating mode, in which the fact of whether or which word lines or word line segments are floating is determined by means of a first electrical functional test. The electrical functional test performed in testwise fashion in the normal operation mode serves, as in a conventional manner, to determine which of the word lines are defective and have to be replaced by redundant word lines. Afterward, with the aid of the method according to embodiments of the invention, it is possible to carry out a second electrical functional test, in which the type of defect of the affected word lines or word line segments is determined in order to predict whether the defective word line, after having been electrically decoupled and replaced by a redundant word line, can still inadvertently open connected memory cells on account of a floating word line potential and prevent proper operation of the semiconductor memory.

Accordingly, it is provided that, in the normal operating mode of the semiconductor memory, the fact of whether and which word lines of the semiconductor memory have floating word line segments is determined by means of the first electrical functional test, and then in the first operating mode, during a second electrical functional test for those word lines that had floating word line segments in the first electrical functional test, information items are written to memory cells, the transistors of which are connected to the word line segments identified as defective by the first electrical functional test, and are read out again, the written information items and the read-out information items being compared with one another. In this type of embodiment, memory cells of those word lines or word line segments that are identified as defective during the first functional test in the normal operation mode are subject to a second electrical functional test carried out in accordance with embodiments of the invention. In this case, the word line segments are deactivated with the aid of the third potential by means of the second line and the second switching element. Consequently, the first switching unit of the driver segment is not involved at all in the second electrical functional test. This for the first time opens up the possibility of carrying out a functional test in which the functioning depends exclusively on the second switching unit of the two switching units of the driver segment. If the second electrical functional test functions and the connected memory cells store information correctly, it is established that the previously identified defect of the word line segment cannot be caused by the second switching unit or a contact hole filling arranged defectively there. In particular, it can be assumed that, in such a case, the first switching unit, which is provided for the deactivation of the word line segment in the normal operation mode, is defective.

It is preferably provided that, in the case when, for a memory cell connected to a word line segment, the check reveals that the read-out information item does not match the written information item, it is ascertained that the second switching element is defective and the semiconductor memory is functional after permanent disconnection of the word line with which the relevant word line segment is associated. Even though in this case it was ascertained in the second electrical functional test that the second switching element is defective, this is not harmful in normal operation of the semiconductor memory, after the relevant word line has been repaired or replaced, because in the normal operating mode the second switching unit merely has the task of activating the word line. Since the word line segment was identified as defective during the first electrical functional test and the second switching unit has been identified as defective during the second electrical functional test, it is possible at least to rule out floating of the word line segment toward the activation potential, the second potential Vpp, in normal operation. Particularly if the first switching unit is still intact, there is an increased probability of the potential of the word line segment floating toward the deactivation potential, the first potential Vnwll, after the permanent disconnection of the word line segment and the replacement of the complete word line by a redundant word line.

It is preferably provided that, in the case when, for a memory cell connected to a word line segment, the check reveals that the read-out information item matches the written information item, it is ascertained that the first switching element of that driver segment to which the word line segment is connected is defective and the semiconductor memory is not functional even after permanent disconnection of the word line with which the relevant word line segment is associated. If successful charge storage is effected in the second electrical functional test, in which the word line segment is both activated and deactivated by means of the second line and the second switching unit, this means that the second switching unit is intact. Since, however, during the first electrical functional test in the normal operating mode, the word line with which the word line segment is associated was identified as defective, the defect must be present at a different location within the driver segment or the leads for the potentials of the word line segment. In particular on account of the frequency with which defective contact hole fillings are responsible for defective word lines, it can be assumed that the error identified in the first electrical functional test is caused by the first switching unit (instead of by the second switching unit) of the driver segment. However, in normal operation, the first switching unit serves to deactivate the word line segment. If such a deactivation does not function, after permanent disconnection of the word line the potential of the word line segment can only float toward the activation potential Vpp and open the connected selection transistors of the replaced word line. Such a semiconductor memory can no longer be used reliably. This means that precisely in the case where the second electrical functional test is passed successively, the semiconductor memory no longer functions in a manner free of errors.

Finally, it is provided that the semiconductor memory operated in testwise fashion is a volatile random access memory, the switching units of which are field effect transistors. By way of example, the first and third switching units may in each case be formed as n-channel transistors and the second switching unit may by contrast be formed as a p-channel transistor, or vice versa.

BRIEF DESCRIPTION OF THE DRAWINGS

The invention is described below with reference to the figures, in which.

The following list of reference symbols can be used in conjunction with the figures:

| | |
|---|---|
| 1 | semiconductor memory |
| 2 | memory cell |
| 3 | selection transistor |
| 4 | storage capacitor |
| 6 | bit line |
| 10 | word line |
| 11 | master word line |
| 12 | word line segment |
| 13 | first contact hole filling |
| 14 | second contact hole filling |
| 16 | first switching unit |
| 17 | second switching unit |
| 18 | third switching unit |
| 20 | driver segment |
| 21 | first line |
| 22 | second line |
| B | first operating mode |
| i1, i2 | information |
| N | normal operating mode |
| n | n-channel transistor |
| p | p-channel transistor |
| SA | sense amplifier |
| t | time duration |
| $T_r$ | storage duration |
| V1, V2 | bias voltage |
| Vgnd | third voltage |
| Vnwll | first voltage |
| Vpp | second voltage |
| Vs | threshold voltage |

DETAILED DESCRIPTION OF ILLUSTRATIVE EMBODIMENTS

Figure 1:
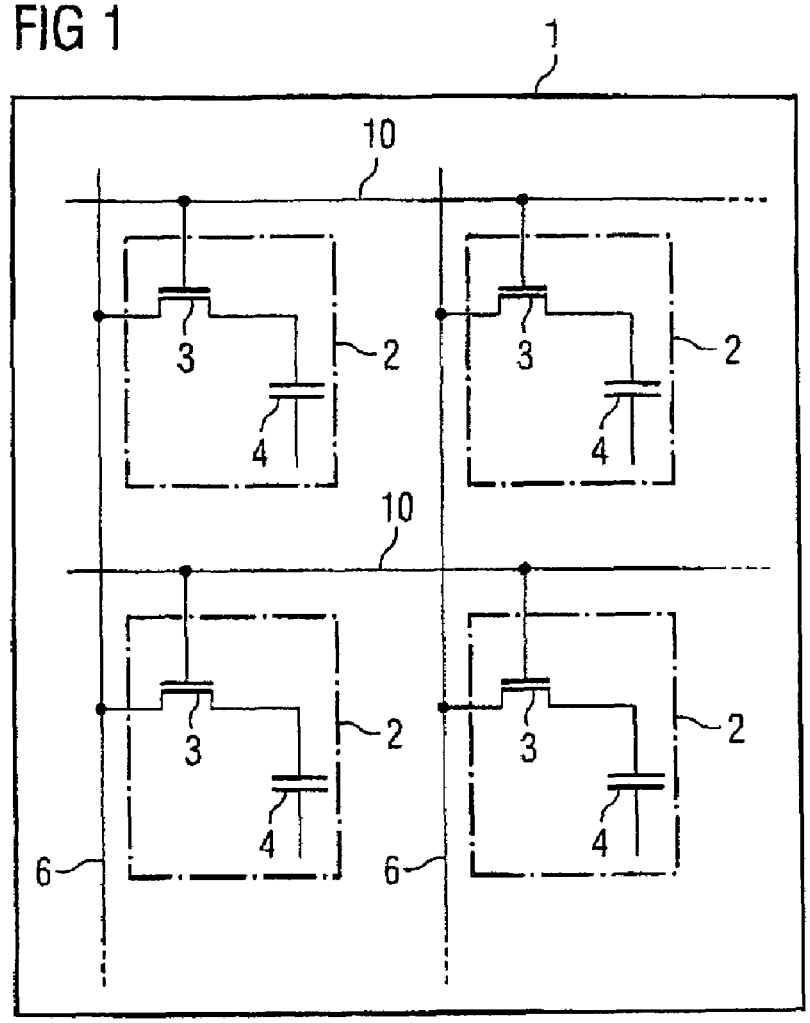
FIG. 1 shows a schematic plan view of a semiconductor memory.

FIG. 1 shows a schematic plan view of an integrated semiconductor memory 1 having a multiplicity of memory cells 2 each having a selection transistor 3 and a storage capacitor 4. The storage capacitor 4 may be a trench capacitor or a stacked capacitor. The selection transistor 3 is preferably a MOSFET, the gate electrode of which is formed by a word line segment 12 (see e.g., FIG. 2) of the word line 10. One source/drain electrode of the selection transistor is connected to a bit line 6. The word lines 10 are in particular segmented word lines, as will be explained in more detail with reference to FIG. 2.

Figure 2:
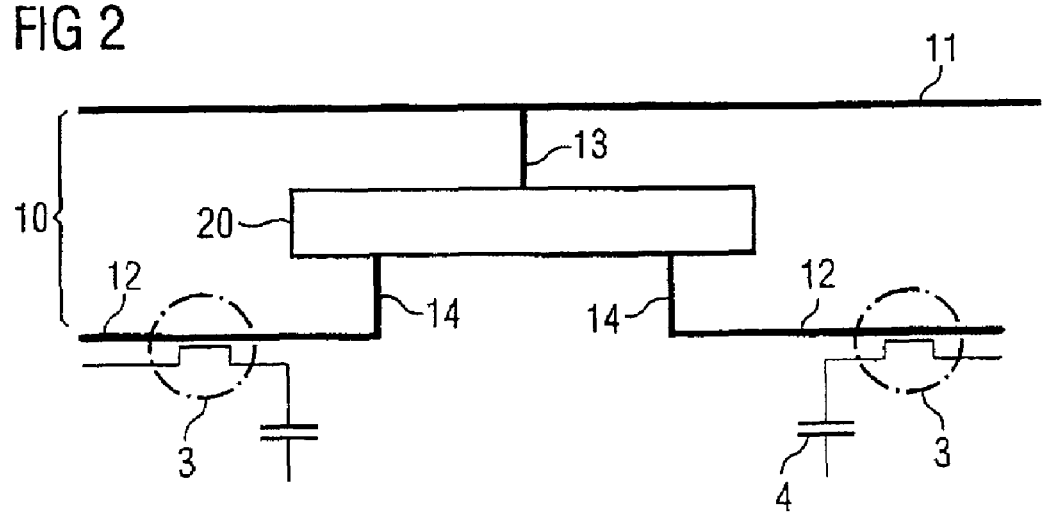
FIG. 2 shows a schematic illustration of a segmented word line with a driver segment of a word line driver.

FIG. 2 shows a schematic illustration of a segmented word line 10 having a metallic master word line 11 and a multiplicity of word line segments 12 made, for example, of polysilicon. The word line segments 12 are connected to the master word line 11 by at least one contact hole filling in each case. FIG. 2 illustrates an excerpt from a segmented word line 10 in which the electrical connection between master word line 11 and word line segment 12 leads via a driver segment 20 of the word line driver. The driver segment 20 is connected to the metallic master word line 11 by a first contact hole filling 13. Furthermore, each of the two word line segments 12 represented is connected to the word line segment 20 by a second contact hole filling 14. Further contact hole fillings or different contact connections are also provided within the word line segment 12. If some of them are defective, then this may have the effect that although a word line segment 12 is not in principle electrically decoupled, it can only be deactivated or it can only be activated. Case distinguishing between these two possibilities is important in order to predict whether, after the permanent disconnection of the defective word line, the floating word line segment may adversely affect read-out results of the remaining memory cells of the semiconductor chip.

Figure 3:
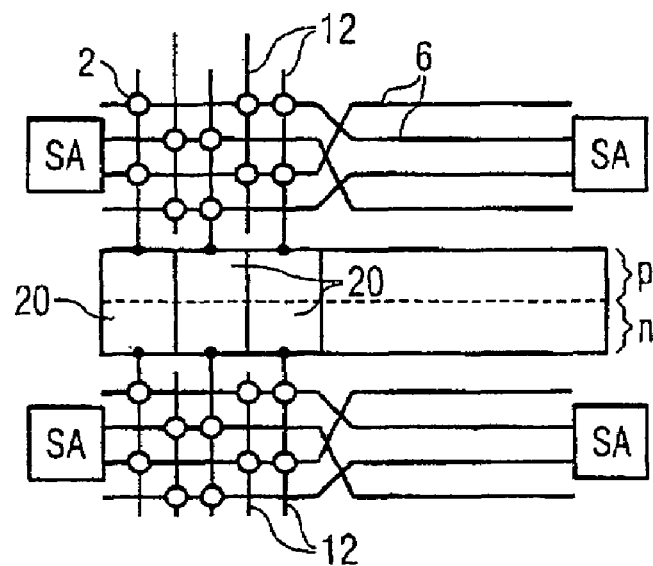
FIG. 3 shows a schematic plan view of part of a semiconductor memory.

FIG. 3 schematically shows an excerpt from a plan view of an integrated semiconductor memory in which memory cells 2 are arranged at crossover locations between word lines 10 and bit lines 6 and the bit lines 6 are in each case led in pairs to sense amplifiers SA that write back the difference between the potentials of the connected bit lines in an amplified manner. The bit lines are twisted bit lines, FIG. 3 illustrating the memory cells 2 only in the region on the left of the overlap locations of the twisted bit lines. A multiplicity of driver segments 20 are indicated in a central level of the plan view, the n-channel transistors n and p-channel transistors p of the driver segments 20 being arranged such that the transistors of a respective uniform conduction type are arranged in a common well. By way of example, in FIG. 3, a multiplicity of p-channel transistors p corresponding to the transistor 17 from FIG. 4 (see below) are arranged in the p-type well, and a multiplicity of n-channel transistors n corresponding to the transistor 16 from FIG. 4 (see below) are arranged in the n-type well n of FIG. 3. Two word line segments 12 in each case are illustrated for five word lines. The successive word line segments 12 of the first, third and fifth word lines from the left in FIG. 3 are in each case jointly connected to the same driver segment 20. The word line segments 12 of the second and fourth word lines from the left in FIG. 3 are connected to further driver segments (not illustrated in FIG. 3).

Figure 4:
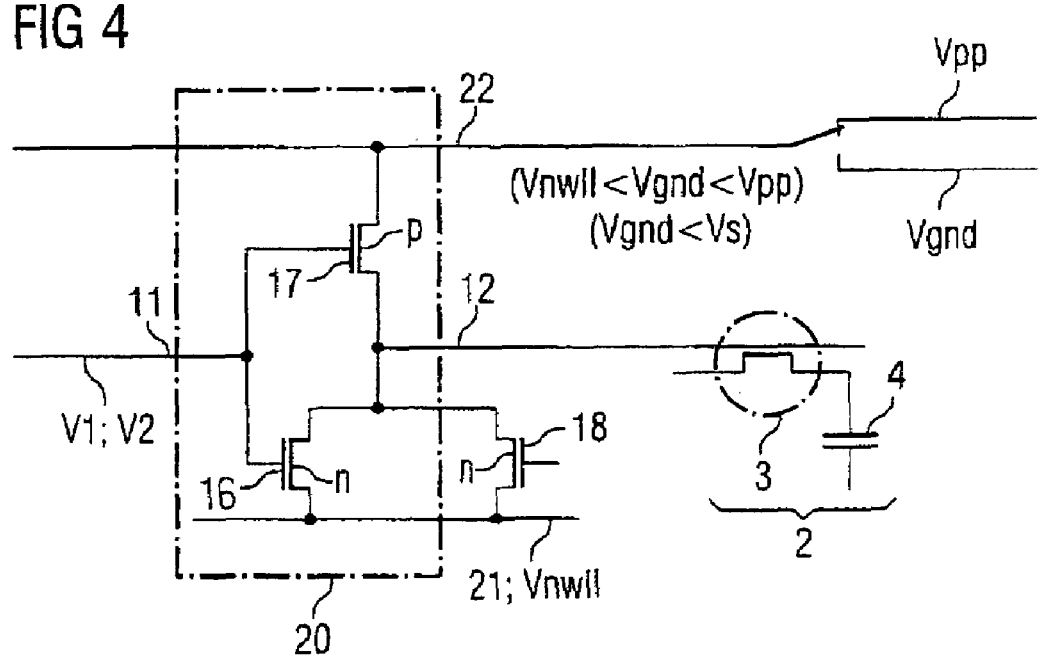
FIG. 4 shows a circuit diagram of a segmented word line in the region of a driver segment.

FIG. 4 shows a circuit diagram of a segmented word line in the region of a driver segment. The driver segment 20 is connected to the master word line 11. The word line segment 12 is connected to the driver segment 20. The word line segment 12 simultaneously forms the gate electrode of a selection transistor 3 of at least one memory cell 2, in the storage capacitor 4 of which a digital information item can be stored. The driver segment 20 of the word line driver is furthermore connected to a first line 21, which provides a first potential Vnwll for the deactivation of the word line segment 12. The driver segment 20 is furthermore connected to a second line 20, which provides a second potential Vpp for the activation of the word line segment 12. The second line 22 can furthermore be biased with a third potential Vgnd, which may be the ground potential for example. The third potential Vgnd has a value lying between the value of the first and second potentials. Furthermore, the value of the third potential Vgnd is chosen such that the threshold voltage leading to the activation of the selection transistors connected to the word line segment 12 is not reached. A word line segment connected to the potential Vgnd is thus deactivated.

The driver segment 20 has a first switching unit 16 and a second switching unit 17. Both switching units are preferably formed as field effect transistors. The field effect transistors 16, 17 are mutually complementary field effect transistors. By way of example, the first switching unit 16 is an n-channel field effect transistor and the second switching unit 17 is a p-channel field effect transistor. The gate electrodes of the two switching units 16 and 17 are connected to the master word line 11 in parallel with one another. By means of the master word line 11, depending on the bias voltage V1 or V2 of the master word line 11, either the first switching unit 16 or the second switching unit 17 is switched into the on state and the respective other of these two switching units is switched into the off state. Consequently, one of the two switching units 16, 17 can be opened through a suitable choice of the potential of the master word line. These switching units serve for conductively connecting the word line segment 12 to either the first line 21 or the second line 22. If the master word line 11 is biased with a bias voltage V1, then as a result the first switching unit 16 is opened and the word line segment 12 is conductively connected to the first line 21. As a result, the word line segment 12 is deactivated. If, by contrast, the master word line is biased with the bias voltage V2, the first switching unit is turned off and the second switching unit 17 is switched into the on state, as a result of which the word line segment 12 is conductively connected to the second line 22.

Furthermore, a third switching unit 18, namely a restore transistor, is provided, which is likewise preferably formed as a field effect transistor, to be precise as a field effect transistor of the same conductivity type as the first switching unit 16. In FIG. 4, the first and third switching units 16, 18 are n-channel transistors in each case. The third switching unit 18 serves to ensure that the word line segment 12 cannot assume a different potential value than the first potential Vnwll or the second potential Vpp during normal operation of the semiconductor memory.

If the word line segment 12 has been identified as defective by means of a conventional electrical functional test, often either the first switching unit 16 or the second switching unit 17 is not functional on account of defective contact hole fillings. With the aid of a functional test that is performed, in accordance with embodiments of the invention, additionally in an operating mode carried out in testwise fashion, it is possible to determine which of the two switching units 16, 17 is defective.

The implementation of the method according to embodiments of the invention for operating the semiconductor memory is explained in more detail below with reference to FIGS. 5A to 5D. The method is carried out in a first operating mode, in which the control timing for the word line control is altered.

Figure 5A:
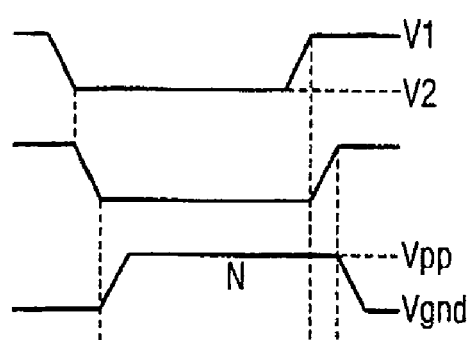
FIG. 5A shows the temporal sequence of potential changes during conventional operation of a word line segment.

In accordance with FIG. 5A taken along with FIG. 4, firstly the bias voltage of the master word line 11 is decreased from a first bias voltage V1 to a second bias voltage V2. As a result, the first switching unit 16 formed as an n-channel transistor is turned off and the second switching unit 17 formed as a p-channel transistor is switched into the on state. Furthermore, the third switching unit 18 provided as restore transistor is likewise turned off and the potential of the second line 22 is subsequently increased from the third potential Vgnd to the second potential Vpp. FIG. 5B illustrates the resultant potential profile of the word line segment 12 for different types of defects. If, as in the case of curve (a), the first and second switching units 16, 17 are intact, the potential of the word line segment 12 is increased from Vwnll to Vpp and the word line segment 12 is thereby activated. In order to deactivate the word line segment 12, in accordance with FIG. 5A, firstly the bias voltage V2 of the master word line 11 is increased to V1 again and then the restore transistor 18 is switched into the on state. As a result, the potential of the word line segment 12 decreases again from Vpp to Vnwll, as can be seen from FIG. 5B, curve (a). The potential of the second line 22 is also subsequently switched to Vgnd again.

If the first switching unit 16 and the second switching unit 17 are defective, that is to say cannot be switched into the on state, this results in the signal profile illustrated in curve (b) in FIG. 5B, in the case of which, after the word line segment 12 has been activated once, a deactivation is no longer possible, since a conductive connection to the first line 21 cannot be produced. If the word line is replaced altogether in the case of such a defect, read-out results of other memory cells may be adversely affected on account of the word line segment then floating toward the second potential Vpp; the semiconductor chip has to be rejected. If, conversely, as illustrated in FIG. 5B, curve (c), the second switching unit 17 is defective, the word line segment 12 cannot even be activated in the first place, but rather only deactivated; the word line potential remains at Vnwll and causes no read-out errors whatsoever in the case of other memory cells even after the word line is replaced by a redundant word line. In such a case, the semiconductor chip can be used after the activation of redundant word lines. A case distinguishing between the cases (b) and (c) in accordance with FIG. 5B is conventionally possible only with the aid of very time-consuming electrical functional tests, the costs of which exceed the benefit. This means that conventionally an unnecessarily large number of semiconductor chips are repaired since the type of defect of a word line can only be determined with a disproportionate outlay.

Figure 5C:
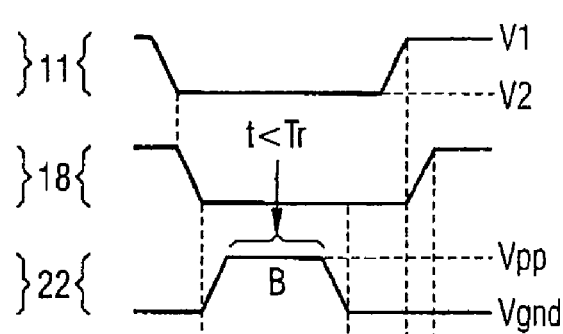
FIG. 5C shows a sequence of potential changes during the operation of a word line segment in accordance with the invention.
Figure 5B:
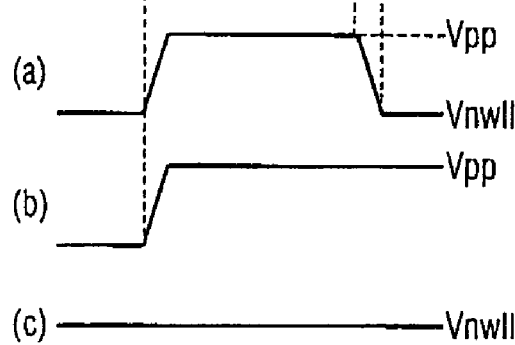
FIG. 5B shows the potential profiles of the word line segment, which result from FIG. 5A.

FIG. 5C shows a method according to embodiments of the invention for operating a semiconductor memory. The activation operation is effected in the same way as in FIG. 5A. As a result, the same rising edges of the potential of the word line segment as in FIG. 5B are produced in FIG. 5D. In FIG. 5C, however, the control timing in the deactivation of the word line segment is altered. The potential of the second line 22 is decreased from the second potential Vpp to the third potential Vgnd before the bias voltage of the master word line 11 is increased from V2 to V1 again and, as a result, the second switching unit 17 is switched into the off state again. If the first and second switching units 16, 17 are intact, as illustrated on the basis of curve (a) in FIG. 5D, this leads to the potential of the word line segment 12 falling firstly to Vgnd and then to Vnwll. The word line segment 12 can therefore also be deactivated in the operating mode carried out in testwise fashion. If, as illustrated in case (c) in FIG. 5D, the second switching unit 17 is defective, the word line segment 12 cannot even be activated in the first place and remains at Vnwll, as in FIG. 5B. If, however, rather than the second switching unit 17, the first and third switching units 16 and 18 are defective or cannot be operated on account of a defective contact-connection, as illustrated in curve (b) in FIG. 5D, the potential of the already activated word line segment 12 is decreased at the same time as the potential of the second line 22 from the second potential Vpp to the third potential Vgnd, since, at this instant, there is still a conductive connection between the word line segment 12 and the second line 22 via the second switching unit 17. If the bias voltage V2 of the master word line 11 is then increased to V1 again at a later instant, the second switching unit is turned off and the word line segment 12 is electrically decoupled. It remains in this case (curve (b)) at the potential Vgnd at which it is deactivated at least temporarily.

Figure 5D:
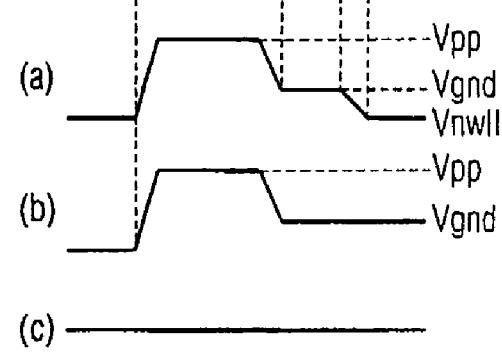
FIG. 5D shows the potential profiles of a word line segment according to the present invention, which result from FIG. 5C.

In this at least temporarily deactivated state in accordance with FIG. 5D, curve (b), the word line segment can be utilized for temporary information storage despite a defective first switching unit 16, whereas, in accordance with curve (b) from FIG. 5B, such storage does not function since the word line segment that is permanently activated with Vpp keeps the selection transistors of the connected memory cells open. In the case of the signal profile achieved in accordance with FIG. 5D curve (b), by contrast, it is possible for an information item to be written to and read from a memory cell connected to the word line segment 12 if the activation and deactivation operation is repeated at least once.

If the information read out is compared with the information written in, then it can be ascertained whether reliable storage is possible in the first operation mode of the semiconductor memory that is carried out in testwise fashion. If this is the case, then the second switching unit 17 is intact and the first switching unit 16 is in all probability defective. This means that, if the word line segment 12 is operated during normal operation of the semiconductor memory, the word line segment cannot be deactivated and floats toward Vpp after the entire word line has been replaced by a redundant word line. In this case, the semiconductor chip has to be rejected. Conversely, if the electrical functional test does not function in the first operating mode, the second switching unit is defective and the first switching unit 16 is apparently intact. Consequently, although the word line segment 12 can no longer be activated, it can be deactivated, so that the semiconductor chip is functional after the entire word line has been replaced.

Figure 6:
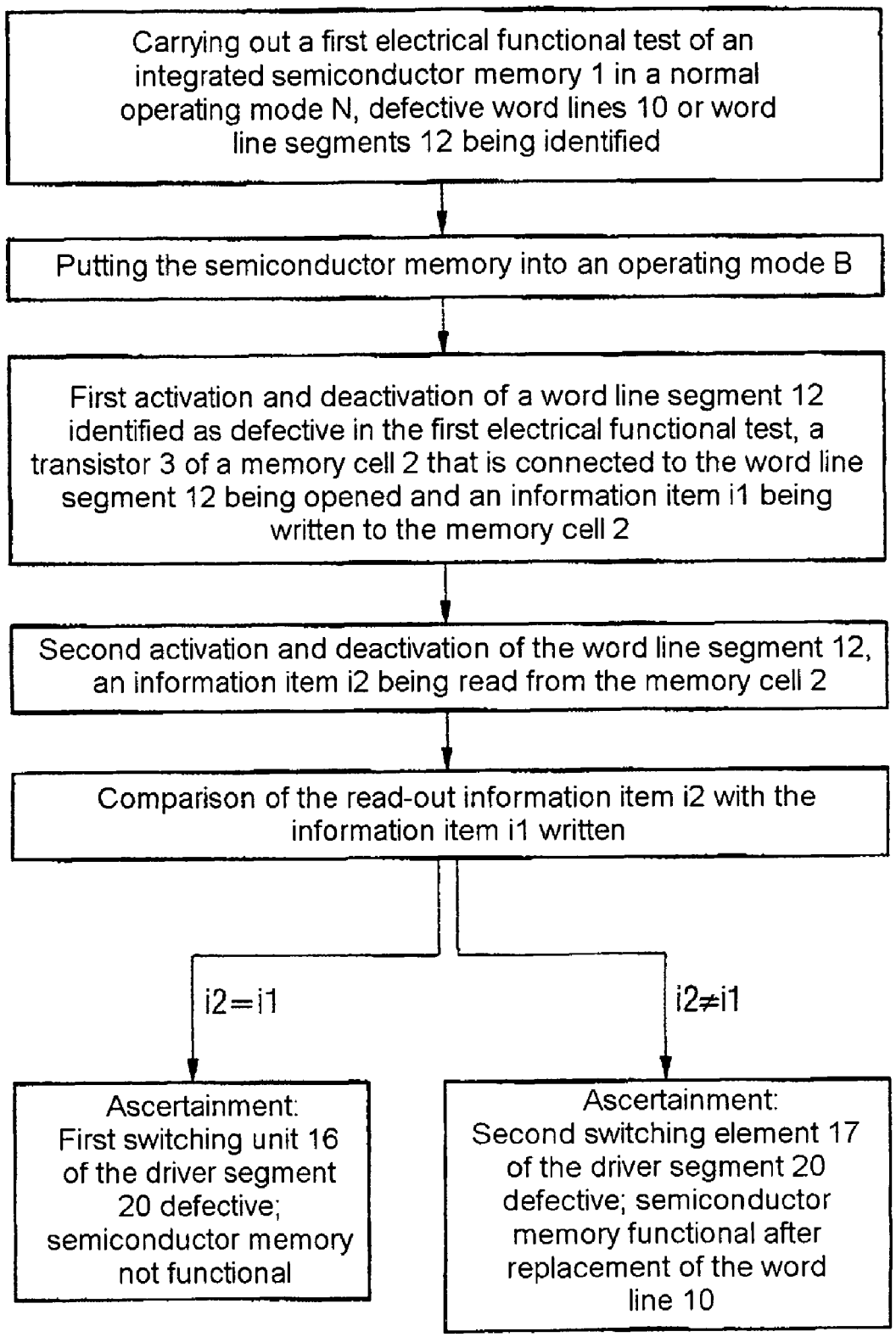
FIG. 6 shows a schematic flow diagram for carrying out a method according to the invention.

FIG. 6 shows a schematic sequence of a method according to embodiments of the invention in a flow chart. Firstly, during normal operation of a semiconductor memory, a first electrical functional test is carried out, which involves determining, as in a conventional manner, whether and which word lines 10 have defective word line segments 12. Afterward, the semiconductor memory, for example through alteration of the control timing, is put into a first operating mode B, which can only be performed in testwise fashion, in order to carry out a second electrical functional test. The second electrical functional test described below involves determining, in accordance with embodiments of the invention, whether the first switching unit 16 or the second switching unit 17 of the driver segment 20 to which the word line segment identified as defective is connected is defective. The fact of whether, after permanent replacement of the word line, the potential of the floating word line segment is floating toward the first potential Vnwll or toward the second potential Vpp depends on which of the two switching units is defective.

Firstly, the word line segment is activated a first time and then deactivated a first time, the deactivation operation being performed in the manner illustrated in FIGS. 5C and 5D. Consequently, the word line segment 12 is then deactivated by means of the second switching unit 17 instead of by means of the first switching unit 16 and is brought to the third potential Vgnd instead of to the first potential Vnwll. While the word line segment is activated the first time, an information item i1 is written to a memory cell connected to the word line segment 12.

Finally, the word line segment is activated and deactivated again a second time as in FIGS. 5C and 5D, an information item i2 being read from the memory cell. A comparison is then effected to determine whether or not the read-out information item i2 matches the written information item i1. If a match is produced, it is ascertained that the first switching unit 16 of the driver segment 20 is defective and the second switching unit 17 is intact. Given this defect finding for the word line segment, the entire semiconductor circuit cannot be used reliably, even after the replacement of the word line to which the word line segment is connected, since there is the risk of the read-out results of arbitrary memory cells being corrupted by the word line floating toward the activation potential.

If, by contrast, it is observed that the read-out information item i2 does not match the information item i1 written in, then it is ascertained that the second switching unit 17 of the driver segment 20 is defective and the first switching unit is intact and, consequently, the semiconductor memory is functional after the replacement of the word line 10.

Preferably, the writing and reading of information items to and from memory cells that are connected to defective word line segments is carried out repeatedly in order to obtain a reliable statement about whether or not a relevant word line segment opens the selection transistors of the connected memory cells. This test is carried out for any appropriate word line segment identified as defective during the first electrical functional test.

What is claimed is:

1. An integrated semiconductor memory comprising:
a word line driver that includes a driver segment;
a word line having a master word line and having at least one word line segment, the word line segment being connected to the driver segment of the word line driver and the driver segment being coupled to the master word line; and
a multiplicity of memory cells, each memory cell having a transistor coupled to a word line;
wherein the word line segment, depending on a bias voltage of the master word line and by means of the driver segment, is electrically connectable either to a first line providing a first potential, which deactivates the word line segment, or to a second line, the second line being able to be biased such that it provides either a second potential, which activates the word line segment, or a third potential, the magnitude of which lies between the first potential and the second potential; and
wherein, in a first operating mode, in which, upon deactivation of the word line segment, the word line segment is biased with the third potential via the second line, the electrical connection between the word line segment and the first line remains interrupted.

2. The semiconductor memory as claimed in claim 1, wherein, in the first operating mode, both upon activation and upon deactivation of the word line segment, the electrical connection between the word line segment and the first line is interrupted and there is a conductive connection between the word line segment and the second line.

3. The semiconductor memory as claimed in claim 1, wherein the driver segment includes a first switching unit and a second switching, the first switching unit being coupled between the word line segment and the first line, and the second switching unit being coupled between the word line segment and the second line, and, depending on the bias voltage of the master word line, either the first switching unit or the second switching unit is being switched into the on state and the respective other switching unit is switched into the off state.

4. The semiconductor memory as claimed in claim 3, wherein, upon deactivation of the word line segment, the master word line is biased with a bias voltage at which word line segment is conductively connected to the second line via the second switching unit, the second line being biased with the third potential upon deactivation of the word line segment.

5. The semiconductor memory as claimed in claim 3, further comprising a third switching that is coupled between the word line segment and the first line in parallel with the first switching unit.

6. The semiconductor memory as claimed in claim 3, wherein the first and second switching units are coupled to the word line segment and/or to the first line and the second line with the aid of contact hole fillings.

7. The semiconductor memory as claimed in claim 6, wherein the semiconductor memory is designed such that, in the first operating mode, the word line segment, after it has been deactivated, is electrically isolated from the second line.

8. The semiconductor memory as claimed in claim 3, wherein the first and second switching units comprise field effect transistors, the first switching unit and the second switching unit being field effect transistors of mutually opposite conductivity types.

9. The semiconductor memory as claimed in claim 1, wherein the second line is controlled such that it provides the second potential upon activation of the word line segment and the third potential upon deactivation of the word line segment.

10. The semiconductor memory as claimed in claim 1, wherein the third potential lies below a threshold voltage of the transistors of the memory cells.

11. The semiconductor memory as claimed in claim 1, wherein the semiconductor memory in the first operating mode stores information items in at least one memory cell coupled to the word line segment and reads them out again, the read-out being effected within a time duration after writing within which the word line segment biased with the third potential turns off the transistor of the memory cell.

12. The semiconductor memory as claimed in claim 1, wherein, in the first operating mode, the word line segment is deactivated by virtue of the fact that the potential of the second line is brought from the second potential to the third potential before the second switching element is turned off and the electrical connection between the word line segment and the second line is interrupted.

13. The semiconductor memory as claimed in claim 1, wherein the semiconductor memory comprises a volatile random access memory.

14. A method for operating an integrated semiconductor memory having at least one word line that includes a master word line and at least one word line segment coupled to a driver segment of a word line driver, the memory further including at least one memory cell having a transistor coupled to the word line segment, wherein, depending on a bias voltage of the master word line, the word line segment is connectable either to a first line providing a first potential or to a second line, the method comprising:

activating the word line segment by coupling the word line segment to the second line and biasing the second line with a second potential that activates the word line segment; and deactivating the word line segment by firstly bringing the potential of the second line from the second potential to a third potential, wherein the magnitude of the third potential lies between the first potential and the second potential, and then electrically isolating the word line segment from the second line.

15. The method as claimed in claim 14, wherein bringing the second potential to a third potential comprises holding the master word line at a bias voltage that conductively connects the word line segment to the second line at least until the potential of the second line has been brought from the second potential to the third potential.

16. The method as claimed in claim 15, wherein the driver segment includes first and second switching units, the first switching unit being coupled between the word line segment and the first line, and the second switching unit being coupled between the word line segment and the second line, and, depending on the bias voltage of the master word line, either the first switching unit or the second switching unit being switched into the on state and the respective other switching unit being switched into the off state and wherein the bias voltage conductively connects the word line segment to the second line via the second switching unit.

17. The method as claimed in claim 14, wherein the word line segment is activated a first time and deactivated again, in which case, with the aid of the word line segment activated for the first time, a transistor of a memory cell is opened and an information item is written to the memory cell, and the word line segment is activated a second time and deactivated again, an information item being read from the memory cell with the aid of the word line segment activated for the second time.

18. The method as claimed in claim 17, wherein a temporal interval between the first deactivation of the word line segment and the second activation of the word line segment is chosen to be shorter than a refresh time in a normal operating mode of the semiconductor memory.

19. The method as claimed in claim 17, further comprising performing a check to determine whether the information item read from the memory cell matches the information item previously written to the memory cell.

20. The method as claimed in claim 14, comprising identifying various types of defects of word line segments by the performing the steps of activating the word line segment and deactivating the word line segment.

21. The method as claimed in claim 20, further comprising operating the semiconductor memory in a normal operating mode prior to activating the word line segment and deactivating the word line segment, wherein whether or which word lines or word line segments are floating is determined by means of a first electrical functional test.

22. The method as claimed in claim 21, wherein:
whether or which word lines of the semiconductor memory have floating word line segments is determined by means of the first electrical functional test in the normal operating mode;
activating the word line segment and deactivating the word line segment are performed during a first operating mode;
the first operating mode further comprises performing a second electrical functional test for those word lines for which floating word line segments were determined in the first electrical functional test, the second electrical functional test comprising:
writing information items to memory cells that have transistors coupled to the word line segments found to be floating during the first electrical functional test;
reading out the written information items; and
comparing the read-out information items with the written information items.

23. The method as claimed in claim 22, wherein the driver segment includes first and second switching units, the first switching unit being coupled between the word line segment and the first line, and the second switching unit being coupled between the word line segment and the second line, and, depending on the bias voltage of the master word line, either the first switching unit or the second switching unit being switched into the on state and the respective other switching unit being switched into the off state and wherein the bias voltage conductively connects the word line segment to the second line via the second switching unit, and wherein when the comparing reveals that the read-out information item does not match the written information item, the method further comprises ascertaining that the second switching element of that driver segment to which the word line segment is connected is defective and the semiconductor memory is functional after permanent disconnection of the word line with which the word line segment is associated.

24. The method as claimed in claim 23, when the comparing reveals that the read-out information item matches the written information item, the method comprises ascertaining that the first switching element of that driver segment to which the word line segment is coupled is defective and the semiconductor memory is not functional even after permanent disconnection of the word line with which the word line segment is associated.

25. The method as claimed in claim 14, wherein the driver segment includes first and second switching units, the first switching unit comprising a first field effect transistor coupled between the word line segment and the first line, and the second switching unit comprising a second field effect transistor coupled between the word line segment and the second line, and wherein the memory cells comprise volatile random access memory cells.

* * * * *

UNITED STATES PATENT AND TRADEMARK OFFICE
CERTIFICATE OF CORRECTION

PATENT NO. : 7,248,536 B2
APPLICATION NO. : 11/245455
DATED : July 24, 2007
INVENTOR(S) : Schroeder et al.

It is certified that error appears in the above-identified patent and that said Letters Patent is hereby corrected as shown below:

In the Inventors Field (75) on the Title Page, line 4: delete "Dorfen" and insert --Muenchen--

Signed and Sealed this

Twenty-seventh Day of November, 2007

JON W. DUDAS
*Director of the United States Patent and Trademark Office*